US011131117B2

(12) United States Patent
Shah et al.

(10) Patent No.: US 11,131,117 B2
(45) Date of Patent: Sep. 28, 2021

(54) ELECTROMAGNETIC-BASED SENSOR WITH COLD MIRROR COVER

(71) Applicant: MAGNA CLOSURES INC., Newmarket (CA)

(72) Inventors: Aashwita Shah, Mississauga (CA); Traian Miu, Oakville (CA)

(73) Assignee: MAGNA CLOSURES INC., Newmarket (CA)

( * ) Notice: Subject to any disclaimer, the term of this patent is extended or adjusted under 35 U.S.C. 154(b) by 0 days.

(21) Appl. No.: 16/811,577

(22) Filed: Mar. 6, 2020

(65) Prior Publication Data

US 2020/0291676 A1    Sep. 17, 2020

Related U.S. Application Data

(60) Provisional application No. 62/968,505, filed on Jan. 31, 2020, provisional application No. 62/816,945, filed on Mar. 12, 2019.

(51) Int. Cl.
*E05B 17/10* (2006.01)
*H03K 17/96* (2006.01)

(52) U.S. Cl.
CPC ......... *E05B 17/10* (2013.01); *H03K 17/9622* (2013.01); *H01H 2239/032* (2013.01); *H03K 2217/960785* (2013.01)

(58) Field of Classification Search
CPC ..... B60R 25/04; E05B 17/10; H03K 17/9622; H03K 17/96; H03K 2217/960785; H03K 2217/96054; H03K 2217/96058; H03K 17/94; H01H 2239/032

USPC ...................................................... 340/5.72
See application file for complete search history.

(56) References Cited

U.S. PATENT DOCUMENTS

| 5,552,927 A | 9/1996 | Wheatly et al. |
| 6,076,948 A * | 6/2000 | Bukosky ............. B60Q 1/2665 340/475 |
| 6,741,729 B2 | 5/2004 | Bjorn et al. |
| 8,400,265 B2 | 3/2013 | Sarioglu et al. |
| 10,099,656 B2 | 10/2018 | Pribisic et al. |

(Continued)

FOREIGN PATENT DOCUMENTS

| WO | 2017148678 A1 | 9/2017 |
| WO | 2018004615 A1 | 1/2018 |

*Primary Examiner* — Emily C Terrell
(74) *Attorney, Agent, or Firm* — Dickinson Wright PLLC

(57) ABSTRACT

An electromagnetic-based sensor system includes a sensor assembly with a biometric identification sensor to determine a unique biometric characteristic of a user using a first non-visible electromagnetic radiation. Specifically, a palm vein sensor may measure a unique pattern of veins in a user's palm using near-field infrared light. A gesture sensor uses a second non-visible electromagnetic radiation, such as infrared or radio frequency to detect movement in a specific gesture pattern. An object detection sensor uses a third non-visible electromagnetic radiation to detect the presence of an object. A mirror overlies the sensor assembly and is reflective to visible light and transmissive to the non-visible electromagnetic radiation. The sensor assembly may be used within a vehicle to authenticate an individual user as an authorized user to unlock the vehicle. One or more settings of the vehicle may be set to predetermined values depending on the identity of the user.

20 Claims, 16 Drawing Sheets

(56) References Cited

U.S. PATENT DOCUMENTS

| | | |
|---|---|---|
| 10,107,026 B2 | 10/2018 | Dezorzi et al. |
| 10,467,471 B2 | 11/2019 | Lee et al. |
| 10,533,350 B2 | 1/2020 | Schatz et al. |
| 2006/0232379 A1* | 10/2006 | Shelley .............. G07C 9/00309 340/5.62 |
| 2006/0291225 A1* | 12/2006 | Todd .................... B60Q 1/2665 362/494 |
| 2007/0058841 A1* | 3/2007 | Miura ..................... E05B 81/76 382/115 |
| 2008/0112600 A1* | 5/2008 | Miura ..................... G06K 9/00 382/125 |
| 2010/0148923 A1* | 6/2010 | Takizawa ........... G07C 9/00571 340/5.82 |
| 2013/0229508 A1 | 9/2013 | Li et al. |
| 2014/0249853 A1 | 9/2014 | Proud et al. |
| 2015/0353033 A1 | 12/2015 | Pribisic et al. |
| 2018/0170309 A1 | 6/2018 | McMahon et al. |
| 2018/0238099 A1 | 8/2018 | Schatz et al. |
| 2018/0367139 A1 | 12/2018 | Pribisic et al. |
| 2019/0085600 A1 | 3/2019 | Leonardi et al. |
| 2019/0128040 A1 | 5/2019 | Mitchell |
| 2019/0152433 A1 | 5/2019 | Cumbo |
| 2020/0072947 A1 | 3/2020 | Miu et al. |

* cited by examiner

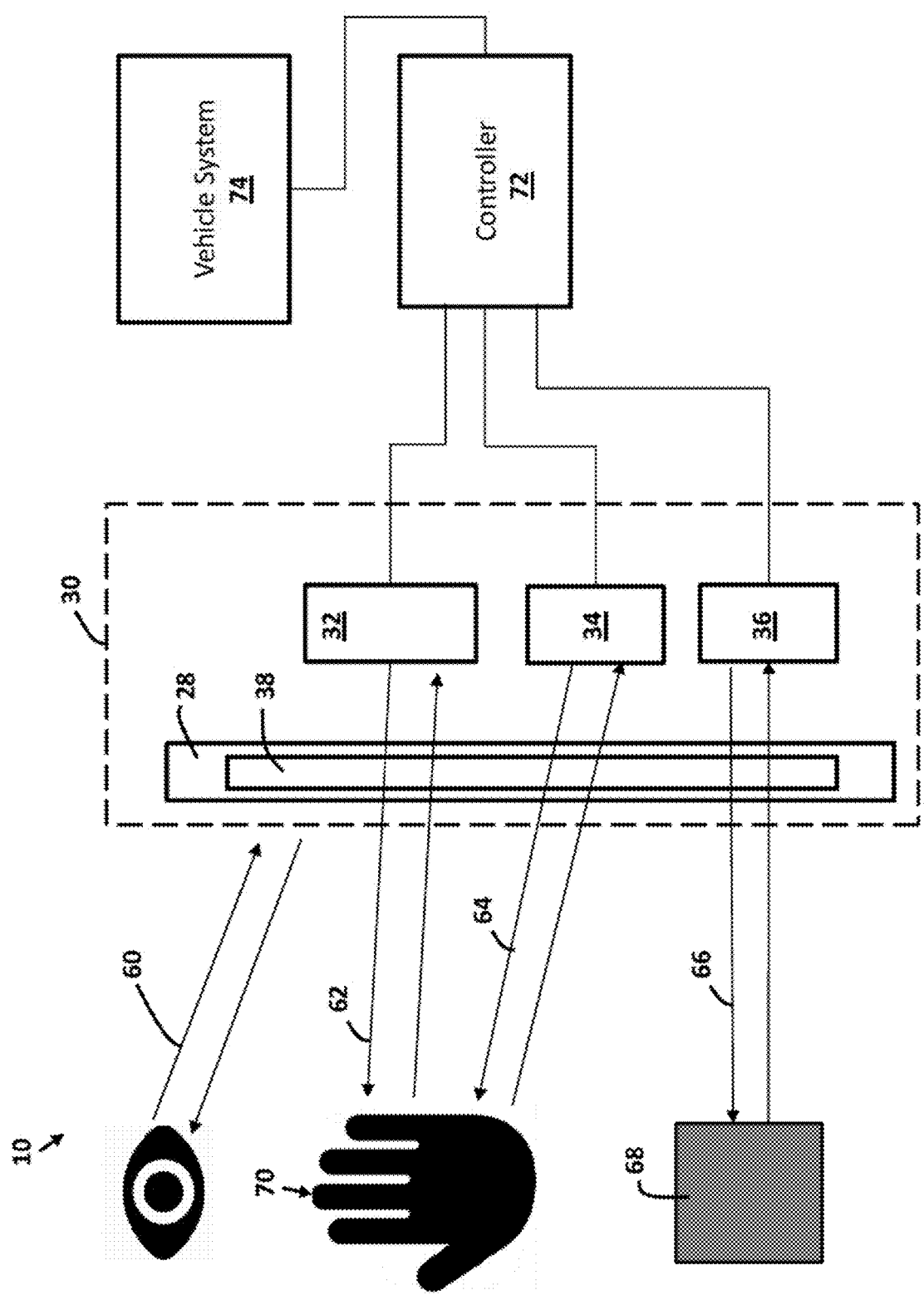

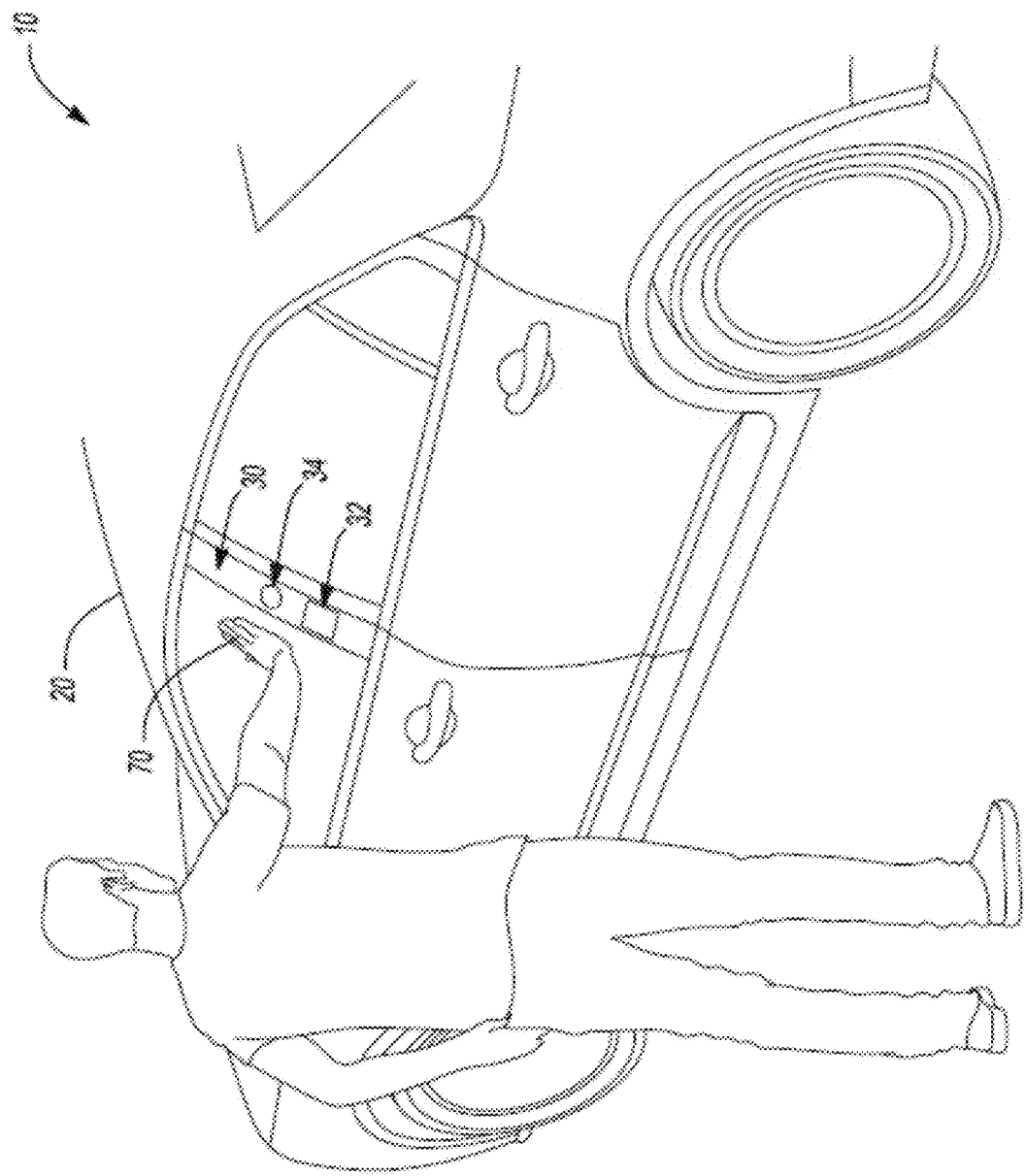

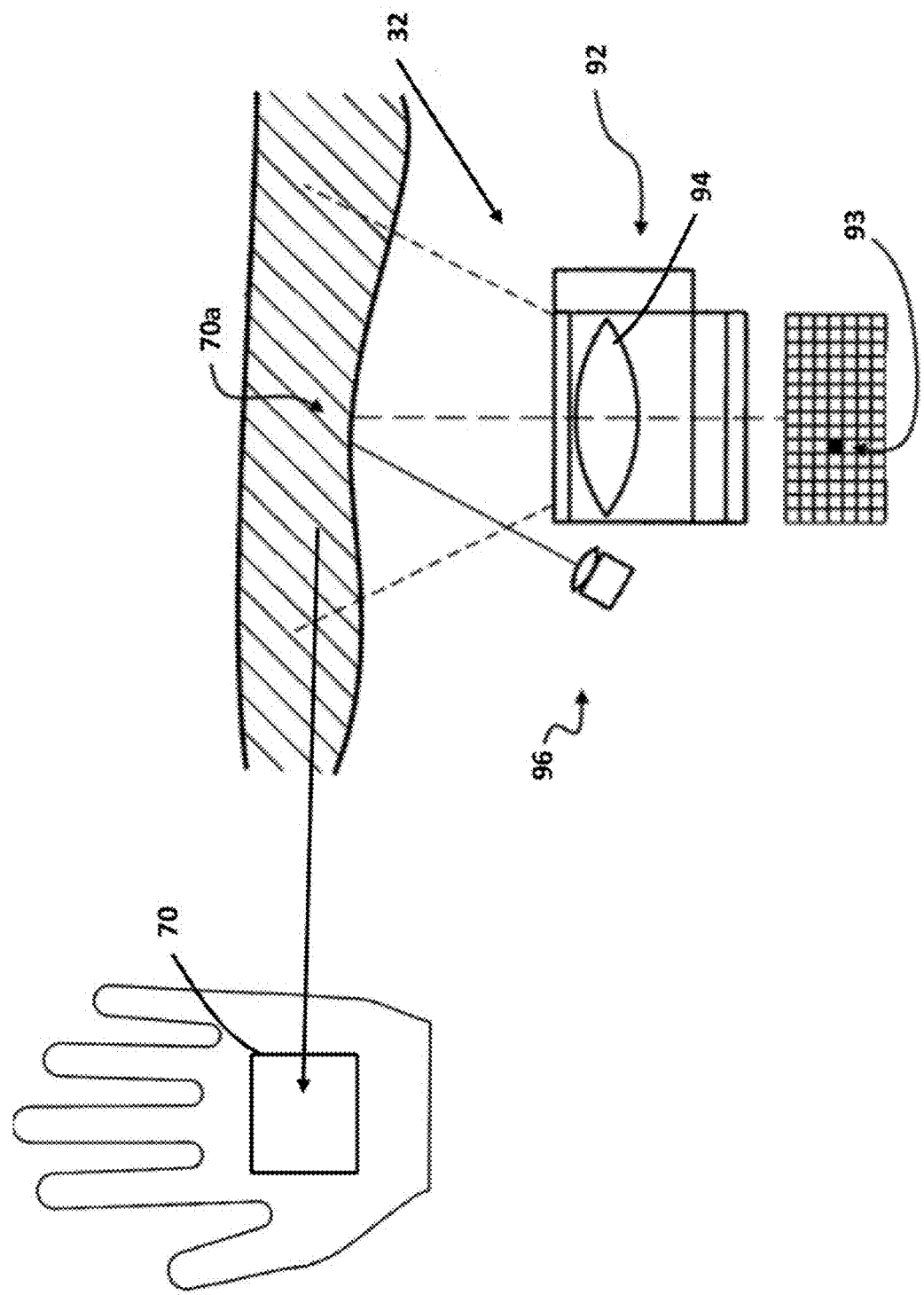

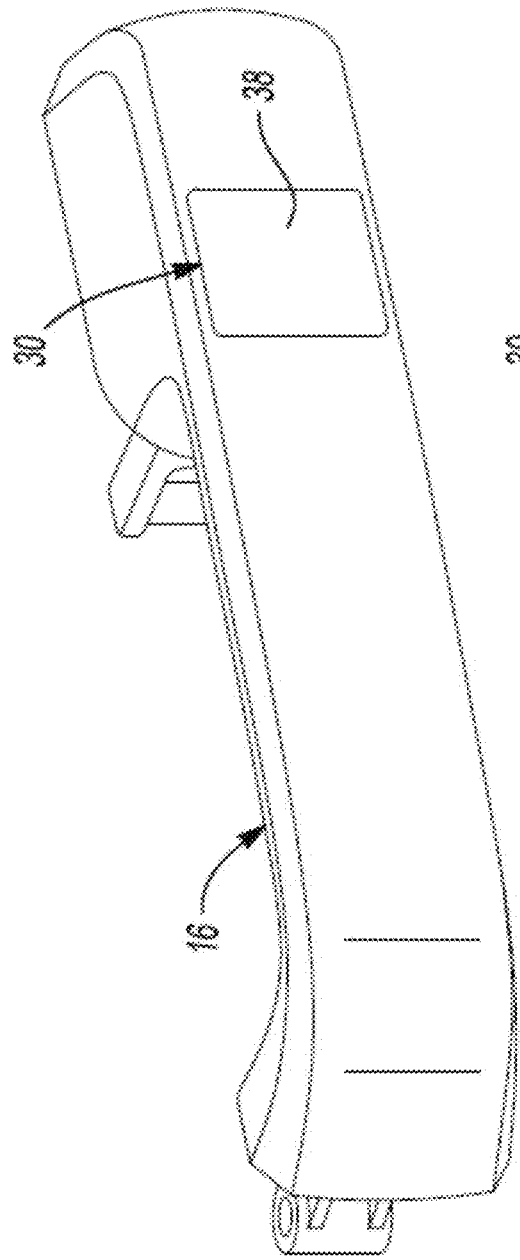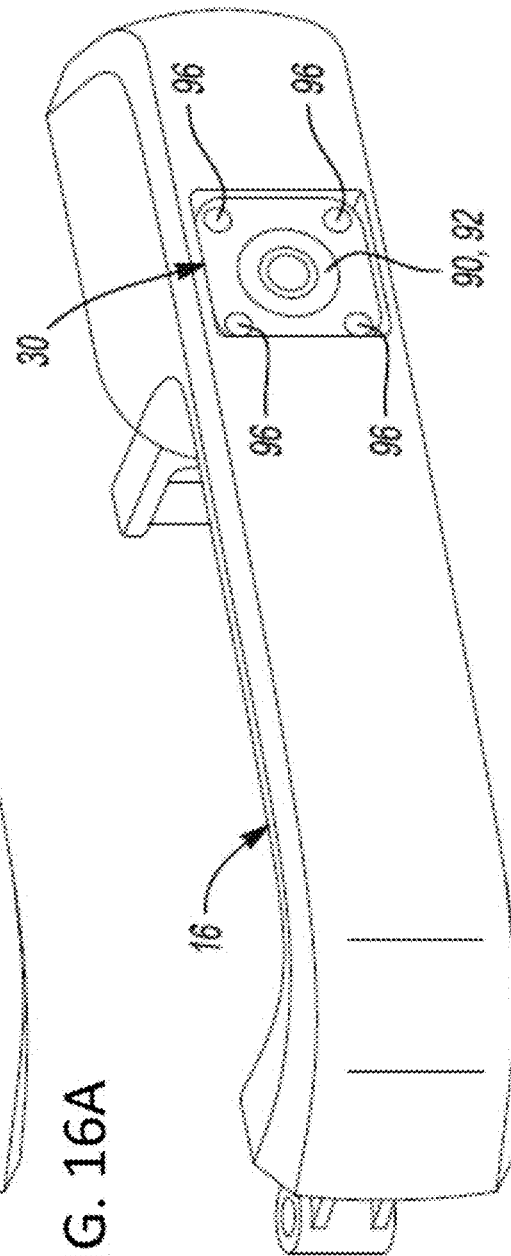

ELECTROMAGNETIC-BASED SENSOR WITH COLD MIRROR COVER

CROSS-REFERENCE TO RELATED APPLICATIONS

This application claims the benefit of U.S. Provisional Application No. 62/816,945, filed Mar. 12, 2019, titled "Electromagnetic-Based Sensor with Cold Mirror Cover," and U.S. Provisional Application No. 62/968,505, filed Jan. 31, 2020, titled "Electromagnetic-Based Sensor with Cold Mirror Cover," the contents of which are hereby incorporated by reference in their entirety.

FIELD

The present disclosure relates generally to electromagnetic-based biometric sensor, and more particularly to a biometric sensor disposed behind a mirror.

BACKGROUND

This section provides background information related to the present disclosure, which is not necessarily prior art.

Many passenger vehicles and trucks are now equipped with keyless entry systems that function alone or in combination with a traditional mechanical-type (i.e. key) entry system. In many instances, the keyless entry system includes a portable device, such as a key fob, having pushbuttons that can be manipulated to unlock/lock the vehicle doors as well as perform other functions (e.g. opening a trunk or lift gate, selective activation of alarms, and/or the ignition system) through encoded RF signals transmitted to a vehicle-installed receiver. Typically, the signals supplied to the receiver are primarily used to control the selective locking and unlocking of a power-operated door latch mechanism.

Certain vehicles may be equipped with a vehicle-mounted keyless entry system. Typically, a touch device, such as a keypad, is mounted to the vehicle in close proximity to the door handle (e.g. on the door or the B-pillar) which enables an authorized user to enter a passcode consisting of a sequence of alpha or numerical codes. Upon verification of the passcode, an on-board controller unit controls operation of the power-operated door latch mechanism. The keypad may also be used to control other vehicle operational functions such as, for example, power release of the gas tank cover or the tailgate lift system following entry and verification of the correct passcode. Some keypads use pushbuttons and/or switches to enter the authentication code. One example of a touchless keyless entry keypad associated with a vehicle entry system is disclosed in U.S. Pat. No. 8,400,265 (hereinafter the '265 patent") the entire disclosure of which is herein incorporated by reference. As disclosed in the '265 patent, a plurality of proximity sensors, such as capacitive sensors, are used as the code input interfaces associated with the keypad.

Still other vehicles may be equipped with a passive keyless entry (PKE) system which utilizes a transmitter carried by the user to provide a signal to the vehicle mounted receiver for controlling activation of the power-operated door latch mechanism with some limited tactile input from the user. Typically, close proximity of the transmitter to the vehicle and a single action, such as touching the door handle or waving in proximity to a motion detector, act to control the locking and unlocking function of the vehicle door.

While such keyless entry systems have found widespread applications in vehicle door systems (i.e. passenger doors, tailgates and closure doors), a need exists to continually advance the art and address known deficiencies associated with conventional keyless entry systems. For example, a need exists to provide additional authentication protocol to improve security and limit unintended access to the vehicle's passenger and/or storage compartments. Another need to be addressed includes allowing a user to securely access the vehicle without requiring the user to carry any specific device, and simultaneously providing a smooth appearance on the vehicle, without a visible keypad. Yet another need exists to identify an individual user using a unique biometric characteristic in order to provide the user with personalized settings.

SUMMARY

This section provides a general summary of the disclosure and is not intended to act as a comprehensive and exhaustive disclosure of its full scope or all of its features, advantages, objectives and aspects.

The present disclosure provides a sensor assembly that includes an electromagnetic-based sensor with a mirror overlying the electromagnetic-based sensor. Specifically, the subject sensor assembly includes an electromagnetic-based sensor configured to sense a non-visible electromagnetic radiation using a first non-visible electromagnetic radiation, and the mirror which is reflective to visible light and transmissive to the non-visible electromagnetic radiation sensed by the electromagnetic-based sensor.

The present disclosure also provides a method for operating a sensor assembly. In particular, the method for operating the sensor assembly includes transmitting a non-visible electromagnetic radiation through a mirror to an electromagnetic-based sensor; sensing the non-visible electromagnetic radiation by the electromagnetic-based sensor; and reflecting visible light by the mirror.

The present disclosure provides a vehicle surface for concealing an electromagnetic-based sensor configured to sense a non-visible electromagnetic radiation, the vehicle surface comprising a mirror overlying the electromagnetic-based sensor, the mirror being reflective to visible light and transmissive to the non-visible electromagnetic radiation sensed by the electromagnetic-based sensor.

The present disclosure provides a two-step authentication system using one or more electromagnetic-based sensors configured to sense a non-visible electromagnetic radiation to detect a biometric identifier for validation/authentication and to sense an activation gesture detected for validation/authentication. In a related aspect, each of the detections are performed sequentially. In a related aspect, each of the detections are performed simultaneously. In a related aspect, the mirror overlies the electromagnetic-based sensor, the mirror being reflective to visible light and transmissive to the non-visible electromagnetic radiation sensed by the electromagnetic-based sensor. In all related aspects, the electromagnetic-based sensor behind the mirror is not visible to a user viewing the mirror.

Further areas of applicability will become apparent from the detailed description provided herein. As noted, the description of the objectives, aspects, features and specific embodiments disclosed in this summary are intended for purposes of illustration only and are not intended to limit the scope of the present disclosure.

DRAWINGS

The drawings described herein are for illustrative purposes only of selected embodiments and not all possible implementations and, as such, are not intended to limit the scope of the present disclosure.

FIG. 1 partial perspective side view of a motor vehicle equipped with an electromagnetic-based sensor system according to aspects of the disclosure;

FIG. 4 is a schematic block diagram of an electromagnetic-based sensor system according to aspects of the disclosure;

FIG. 5 illustrates a user placing their palm to a keypad assembly for biometric authentication according to aspects of the disclosure;

FIG. 11 is a schematic diagram of an example biometric identification sensor using near-infrared light to identify a user by veins in the palm according to aspects of the disclosure;

FIGS. 16A-16B illustrate a door handle according to aspects of the disclosure;

Corresponding reference numerals indicate corresponding components throughout the several views of the drawings.

DETAILED DESCRIPTION

Figure 1:
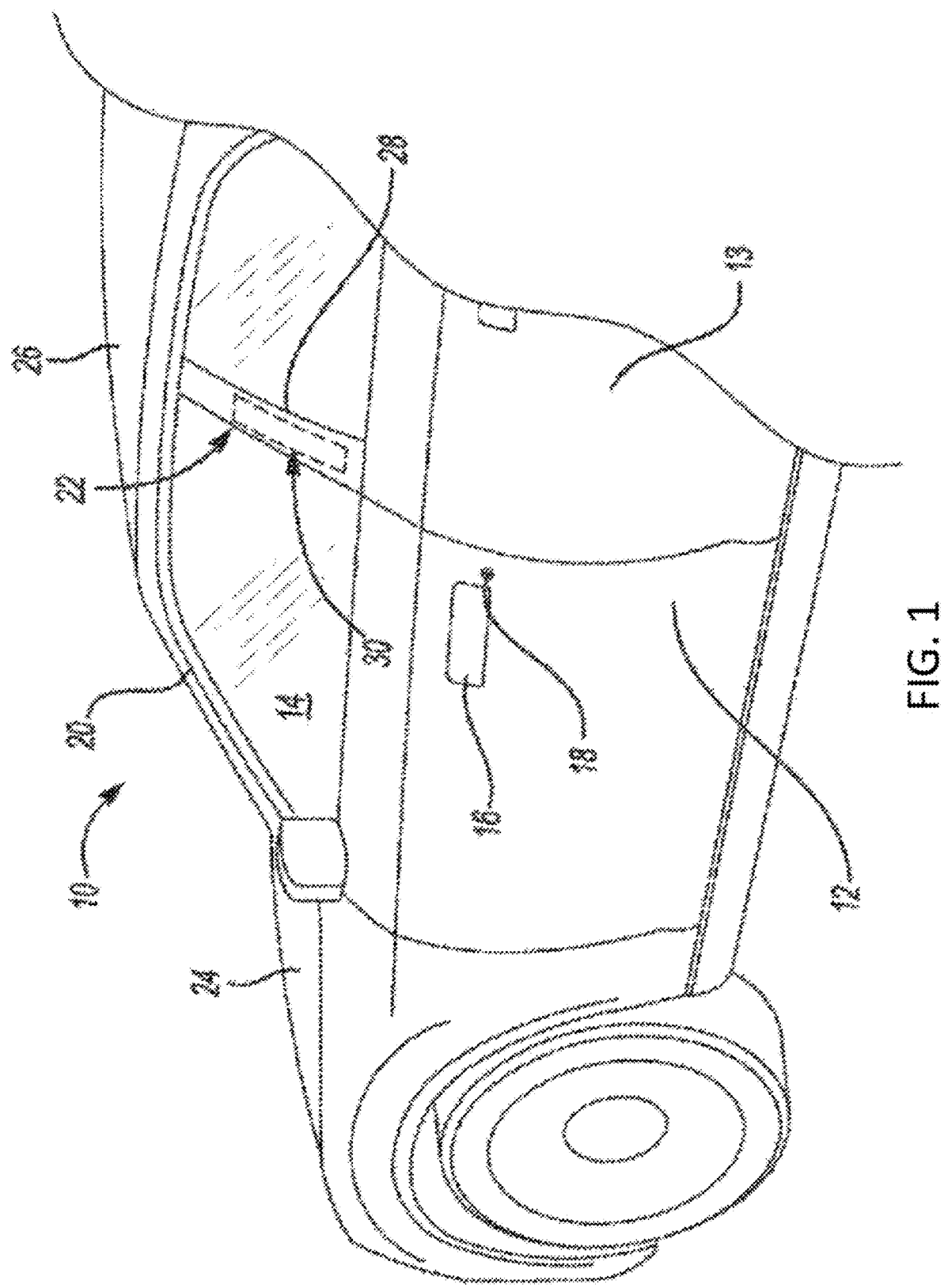

Example embodiments will now be more fully described with reference to the accompanying drawings. However, the following description is merely exemplary in nature and is not intended to limit the present disclosure, its subject matter, applications or uses. To this end, example embodiments of a system and method for sensing non-visible electromagnetic radiation are provided so that this disclosure will be thorough and will fully convey the scope to those skilled in this art. Numerous specific details are set forth, such as examples of specific components, devices and methods to provide a thorough understanding of the embodiments in many different forms, and such should not be construed to limit the intended scope of protection afforded by this disclosure. As is understood, some well-known processes, structures and technologies are not described in detail herein in view of the understanding afforded thereto by those skilled in this art.

In general, the present disclosure relates to an electromagnetic-based sensor system 10 configured to sense a non-visible electromagnetic radiation 62, 64, 66. More particularly, the present disclosure relates to a system 10 for a motor vehicle 20 that includes a sensor assembly 30 having one or more electromagnetic-based sensors 32, 34, 36. The sensor assembly 30 also includes a mirror 38 overlying electromagnetic-based sensor 32, 34, 36, the mirror 38 being reflective to visible light and transmissive to the non-visible electromagnetic radiation 62, 64, 66 sensed by the electromagnetic-based sensors 32, 34, 36. In some embodiments, the mirror 38 may be a cold mirror or a dielectric mirror such as a dichroic filter that is highly reflective to most or all of the visible light spectrum and which is also highly transmissive to non-visible electromagnetic radiation 62, 64, 66 with infrared wavelengths.

Referring now to FIG. 1, a side view of a motor vehicle 20 is shown partially cut away to include a driver-side front door 12 and a driver-side rear door 13 which both provide access to a passenger compartment 14. Front door 12 is shown to include a door handle 16 and a key hole 18 is provided for otherwise conventional locking and unlocking of a mechanically-activated latch mechanism (not shown) mounted within front door 12. Movement of the door handle 16 functions to release the front door 12 to move relative to a body portion 24 of the motor vehicle 20 when the latch mechanism is unlocked. As will be detailed, each of the latch mechanisms may also include a power-operated actuator for controlling the locking and unlocking functions in association with the electromagnetic-based sensor system 10. Motor vehicle 20 is shown to also include a B-pillar 22, and a roof portion 26.

In the example shown in FIG. 1, the B-pillar 22 is covered by a cover plate assembly or applique 28. The sensor assembly 30 associated with the electromagnetic-based sensor system of the present disclosure is mounted to B-pillar 22 within applique 28 (e.g., on a "dry side", or interior side, of the applique 28) at the location identified by the dashed lines. As an alternative, the sensor assembly 30 could be mounted to front door 12 within or in proximity to the door handle 16.

Figure 3:
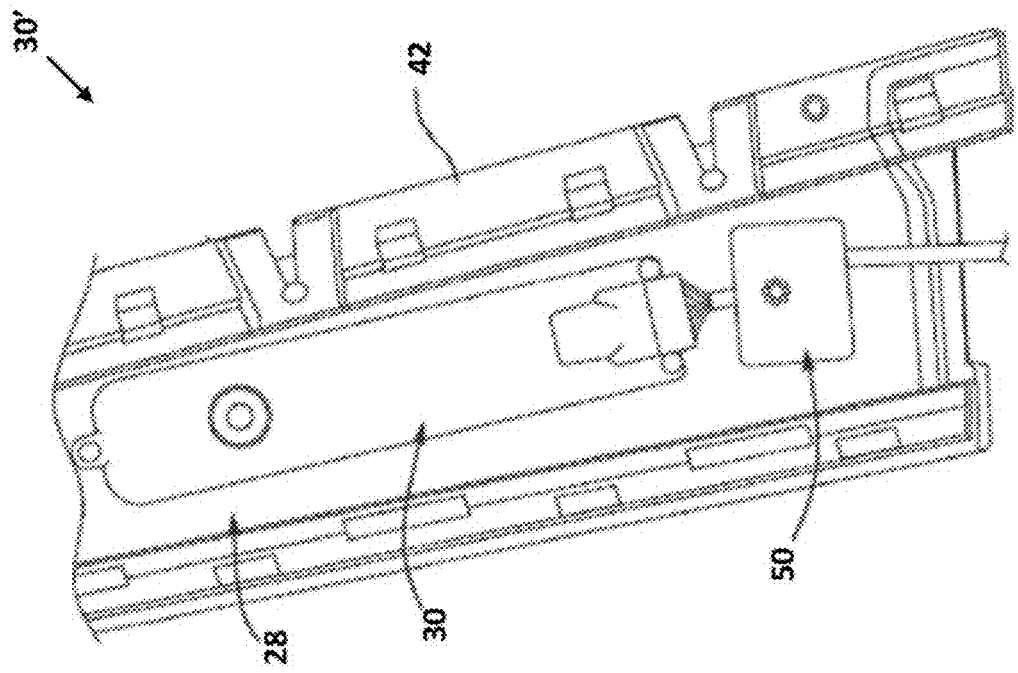
FIG. 3 is an illustration of the biometric identification sensor of FIG. 2 with a cover portion of the cover plate assembly removed for improved clarity.
Figure 2:
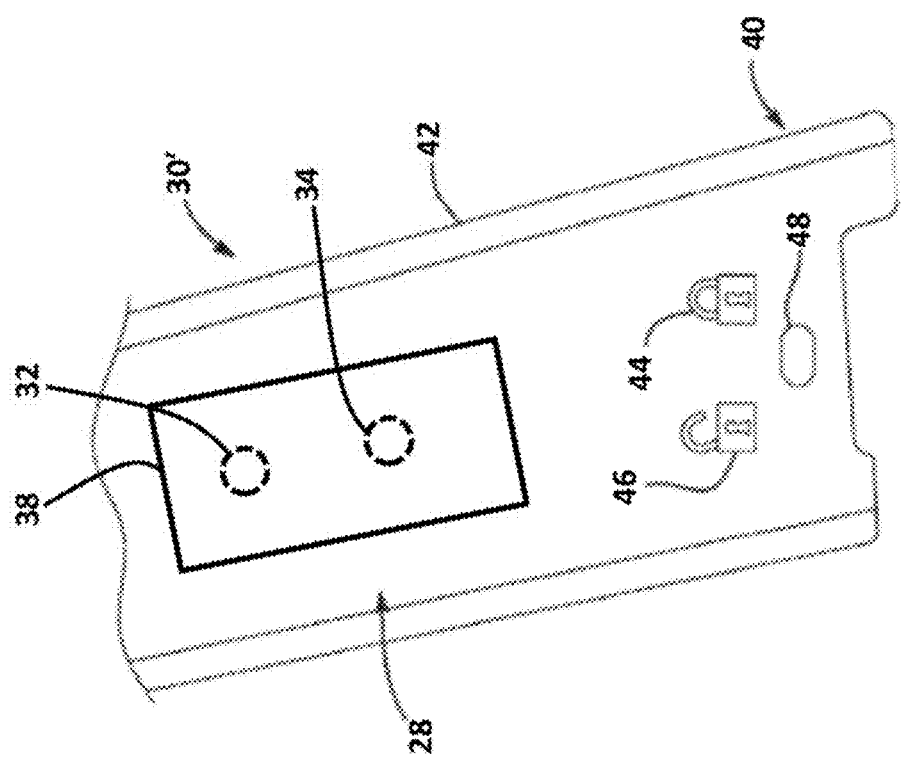
FIG. 2 is an illustration of a biometric identification sensor installed within a cover plate assembly adapted to be mounted to a B-pillar of the motor vehicle.

Referring now to FIGS. 2-3, an example embodiment of the sensor assembly 30 in the form of a B-pillar keypad assembly 30' includes the biometric identification sensor 32 configured to determine a unique biometric characteristic of a user. The sensor assembly 30 also includes a gesture sensor 34 configured to determine a gesture by the user. As also shown in FIG. 2, a mirror 38 overlies each of the biometric identification sensor 32 and the gesture sensor 34. The mirror 38 is reflective to visible light and transmissive to a first non-visible electromagnetic radiation used by the biometric identification sensor 32.

As also shown in FIGS. 2-3, the B-pillar keypad assembly 30' is shown to include cover plate unit 40 having applique 28 mounted to a frame 42. FIG. 2 illustrates the applique 28 including a lock node 44, release node 46, and wake-up switch 48. The lock node 44 and the release node 46 may illuminate or otherwise indicate the locked or unlocked status of the latch mechanism of the door. For example, the release node 46 may illuminate to provide the user with feedback that the latch mechanism is unlocked in response to the sensor assembly 30 successfully authenticating the user as being authorized to access the vehicle interior 14. Similarly, the lock node 44 may illuminate to indicate that the user has successfully caused the latch mechanism to change to a locked status. Additionally or alternatively, the lock node 44 and/or the release node 46 may function as buttons to cause the latch mechanism to be in the corresponding locked or unlocked condition.

As shown in FIG. 3, the keypad assembly 30' may include a lock switch 50, which may provide for a user to cause the latch mechanism to be in a locked or unlocked condition in response to a user command. The lock switch 50 may accept a user command to lock or unlock the latch mechanism, for example, by a numeric keypad or by buttons connected to the lock node 44 and the release node 46.

Referring to FIG. 4, the electromagnetic-based sensor system 10 includes the sensor assembly 30 with the mirror 38 overlying each of the biometric identification sensor 32 and the gesture sensor 34. In the embodiment shown in FIG. 4, the electromagnetic-based sensor system 10 also includes an object detection sensor 36 that is configured to detect an object 68, such as a vehicle, a person, or a fixed structure using a third non-visible electromagnetic radiation 66. Visible light 60 is reflected by the mirror 38 so the biometric identification sensor 32 the gesture sensor 34, and the object detection sensor 36 are not visible to the user. In some embodiments, the mirror 38 may present a reflective mirror surface which may be suitable for use as an exterior or interior rear view mirror, or which may appear as a bright finish, similar to chrome metal. In some embodiments, the mirror 38 may have a colored tint or a dark appearance.

As shown in FIG. 4, the mirror 38 is transmissive to a first non-visible electromagnetic radiation 62 used by the biometric identification sensor 32, allowing the first non-visible electromagnetic radiation 62 to pass therethrough without substantial loss. The mirror 38 is also transmissive to a second non-visible electromagnetic radiation 64 used by the gesture sensor 34. The mirror 38 is also transmissive to the third non-visible electromagnetic radiation 66 used by the object detection sensor 36.

Figure 4A:
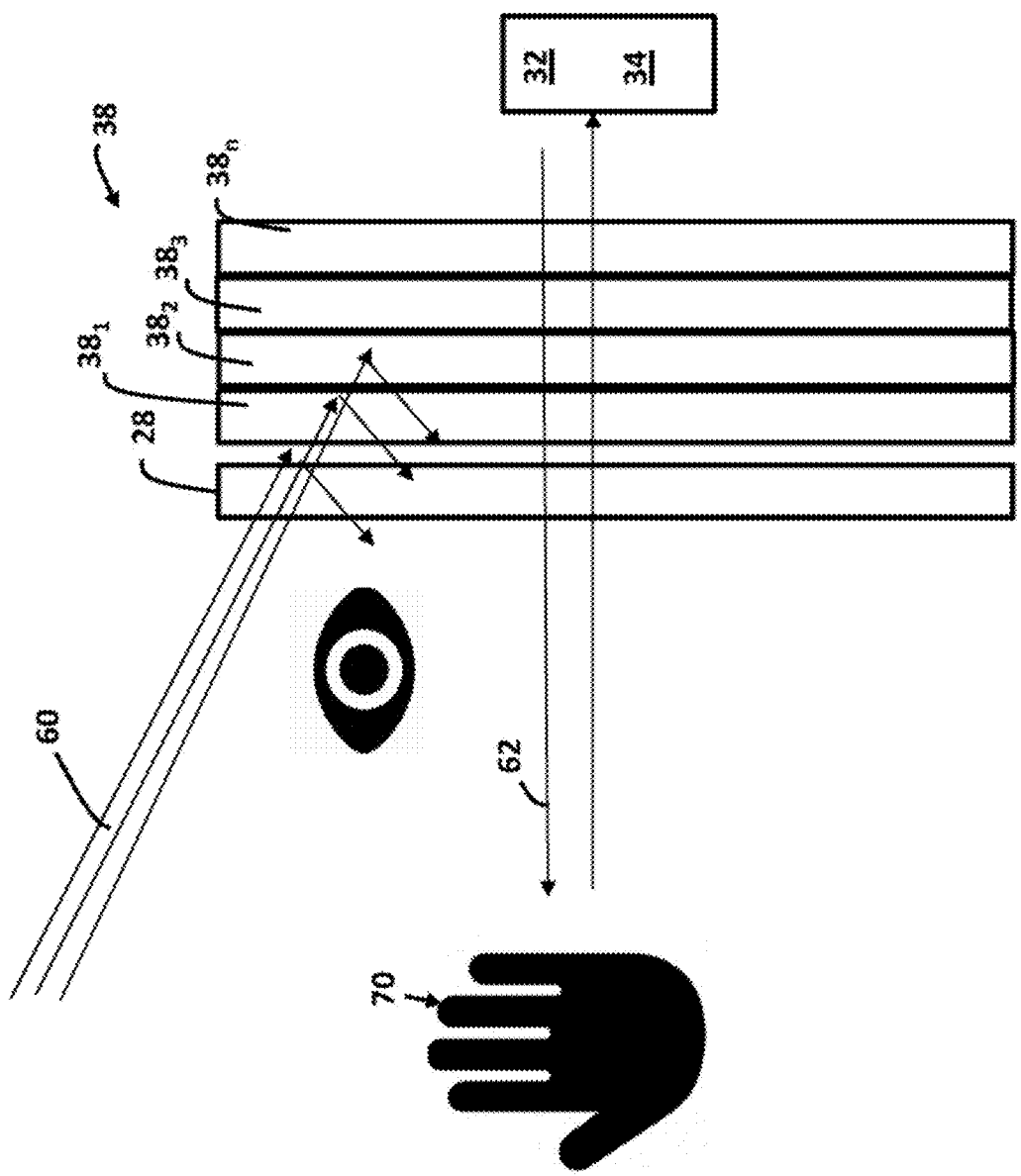
FIG. 4A is an enlarged portion of the schematic block diagram of FIG. 4 according to aspects of the disclosure.

As shown in FIG. 4A, the mirror 38 may be, for example, an all-polymeric cold mirror which reflects visible wavelengths while transmitting a substantial portion of infrared wavelengths. The mirror 38 includes a sufficient number of alternating layers $38_1$ to $38_n$ of at least first and second diverse polymeric materials such that at least 50% of peak reflecting visible light of a wavelength of between about 380-680 nm incident on the mirror is reflected and at least 50% of infrared light between about 680-2000 nm is transmitted or absorbed, as but only an example of a cold mirror, which is described in more detail in U.S. Pat. No. 5,552,927, and which may be used as the mirror 38 in the system 10 of the present disclosure.

In the embodiment shown in FIG. 4, each of the first, second, and third non-visible electromagnetic radiations 62, 64, 66 are transmitted in both directions, into and out of the sensor assembly 30. However, it should be appreciated that the electromagnetic-based sensor system 10 may be configured to have one or more of the first, second, and/or the third non-visible electromagnetic radiation 62, 64, 66 transmitted only in a single direction through the mirror 38, such as, for example, where the user is illuminated by an external source.

The biometric identification sensor 32 is configured to determine a unique biometric characteristic of the user using the first non-visible electromagnetic radiation 62. In some embodiments, the first non-visible electromagnetic radiation 62 is near-infrared light, which may be defined as light having a wavelength of 0.75-1.4 μm. However, it should be appreciated that the biometric identification sensor 32 may additionally or alternatively use other wavelengths of light or other types of non-visible electromagnetic radiation, such as radio-frequency waves. In some embodiments, and as shown in FIG. 4, the biometric identification sensor 32 may determine a unique biometric characteristic of the user by capturing an image of a body part 70 of the user using the first non-visible electromagnetic radiation 62 reflected therefrom. In some embodiments, and as shown on FIG. 4, the body part 70 may be the palm of the hand. However, different body parts 70 may be used. Such body parts 70 may include, for example, one or more fingers, a face, or an eye.

In some embodiments, the first non-visible electromagnetic radiation 62 is absorbed by blood in veins of the body part, making a pattern of the veins visible in the image captured by the biometric identification sensor 32. In this way, the pattern of the veins of the body part 70 may provide the unique biometric characteristic of the user.

As also shown in FIG. 4, the sensor assembly 30 may include a gesture sensor 34, which is configured to determine a gesture by the user using the second non-visible electromagnetic radiation 64. The second non-visible electromagnetic radiation 64 may be the same type or the same frequency as the first non-visible electromagnetic radiation 62. For example, both the biometric identification sensor 32 and the gesture sensor 34 may sense near infrared light. Alternatively, the second non-visible electromagnetic radiation 64 may be different from the first non-visible electromagnetic radiation 62. In some embodiments, the second non-visible electromagnetic radiation 64 may include radio frequency radiation. In other words, the gesture sensor 34 may use Radar to detect the presence and/or the motion of the user's body part 70. In some embodiments, the second non-visible electromagnetic radiation 64 may include infra-red light. The gesture sensor 34 may include a time-of-flight (TOF) sensor to determine the position and/or speed of the body part 70 based on the time it takes for the second non-visible electromagnetic radiation 64 to travel between the gesture sensor 34 and the body part 70. It should be appreciated that the second non-visible electromagnetic radiation 64 may include one or more different wavelengths or types of non-visible electromagnetic radiation. For example non-visible electromagnetic radiation may also include ultraviolet light, or other types of light, as well as electromagnetic waves in the radio or microwaves domain such as in the radar frequencies e.g. 25 Ghz, 81 GHz as non-limiting examples.

In the example embodiment shown in FIG. 4, the second non-visible electromagnetic radiation 64 sensed by the gesture sensor 34 is reflected by the same body part 70 as is detected by the biometric identification sensor 32. However, it should be appreciated that the gesture sensor 34 may detect a gesture by an object or a different body part 70 from the body part 70 used by the biometric identification sensor 32.

In the example embodiment shown in FIG. 4, the system 10 includes a controller 72 in communication with each of the biometric identification sensor 32 and the gesture sensor 34. The controller 72 may take the form of a single, combined device as shown. However, it should be appreciated that each of the biometric identification sensor 32 and the gesture sensor 34 may have their own separate controller 72. The controller 72 may be combined with one or more other processors in a vehicle, such as a body control module (BCM) (not shown). The controller 72 may include a processor (not shown) and a computer-readable memory that may store instructions for execution by the processor. The controller 72 may store biometric profile data corresponding with one or more authorized users. The controller 72 may be configured to compare data from the biometric identification sensor 32 with the stored profile data to determine if an authorized user is present at the sensor assembly 30. Similarly, the controller 72 may store gesture profile data, which may be compared with information from the gesture sensor 34 to detect the presence of a particular gesture.

In the example embodiment shown in FIG. 4, the controller 72 is in communication with a vehicle system 74. This communication may take the form of a wired or wireless connection to the vehicle system to be responsive to a user input and/or recognition of an individual user by the sensor assembly 30. For example, the vehicle system 74 may be a closure control system that unlocks and/or opens the driver door 12 in response to the controller 72 determining that a person is an authorized user. In another example, the vehicle system 74 may be a seat controller that is configured to move the driver's seat to a predetermined position associated with an individual user in response to the controller 72 determining that a person at the driver door 12 is the individual user. In some embodiments, the controller 72 may be in communication with two or more different vehicle systems 74, which may perform different actions in response to the controller 72 recognizing a particular individual and/or in response to detecting a particular gesture.

Referring now to FIG. 5, an embodiment of the electromagnetic-based sensor system 10 includes the sensor assembly 30 disposed adjacent a door of a vehicle 20 for recognizing the user as an authorized user of the vehicle 20 by sensing the body part 70 of the user.

Figure 6:
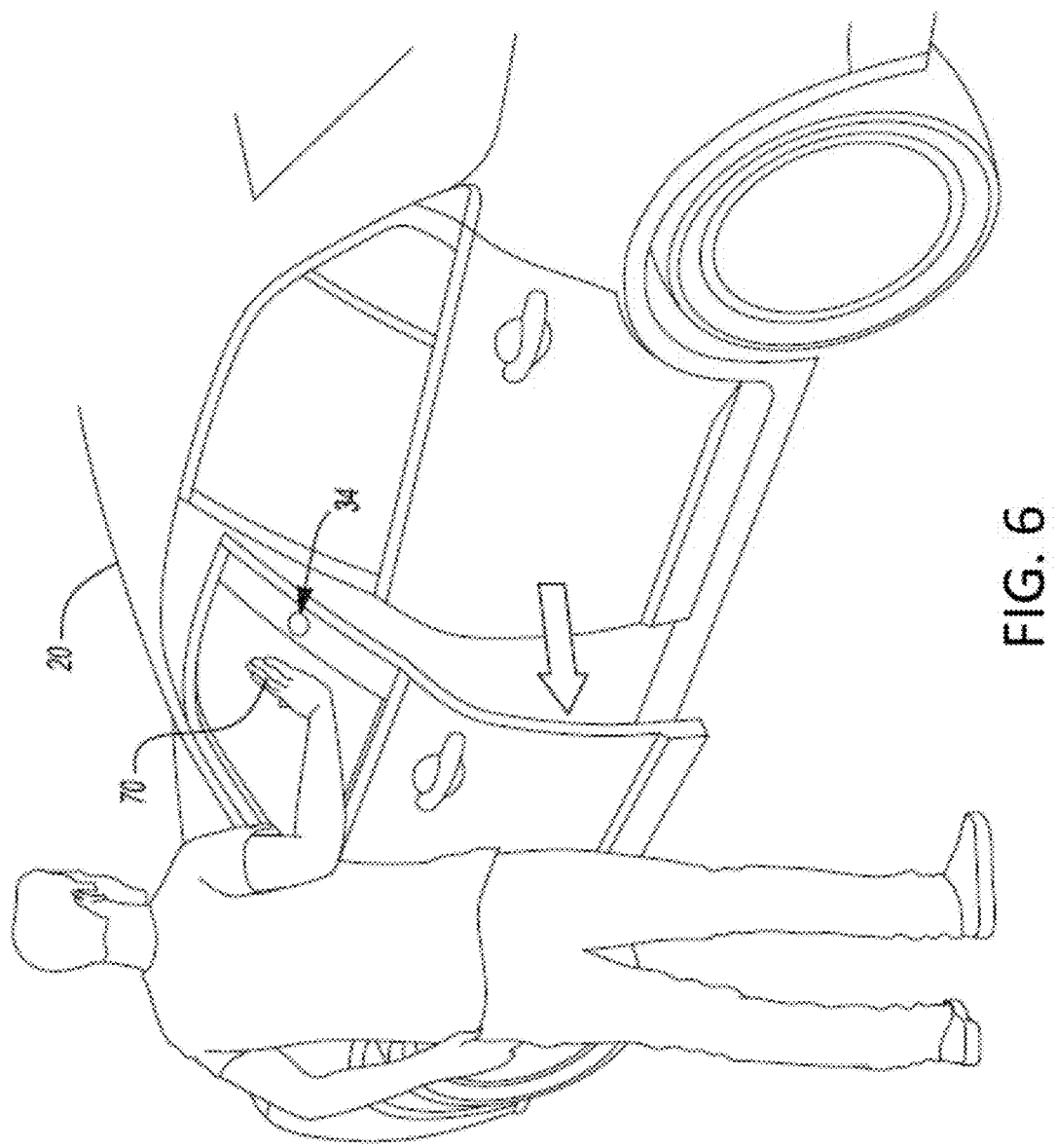
FIG. 6 illustrates a user performing a gesture moving their hand backward away the keypad assembly according to aspects of the disclosure.
Figure 7:
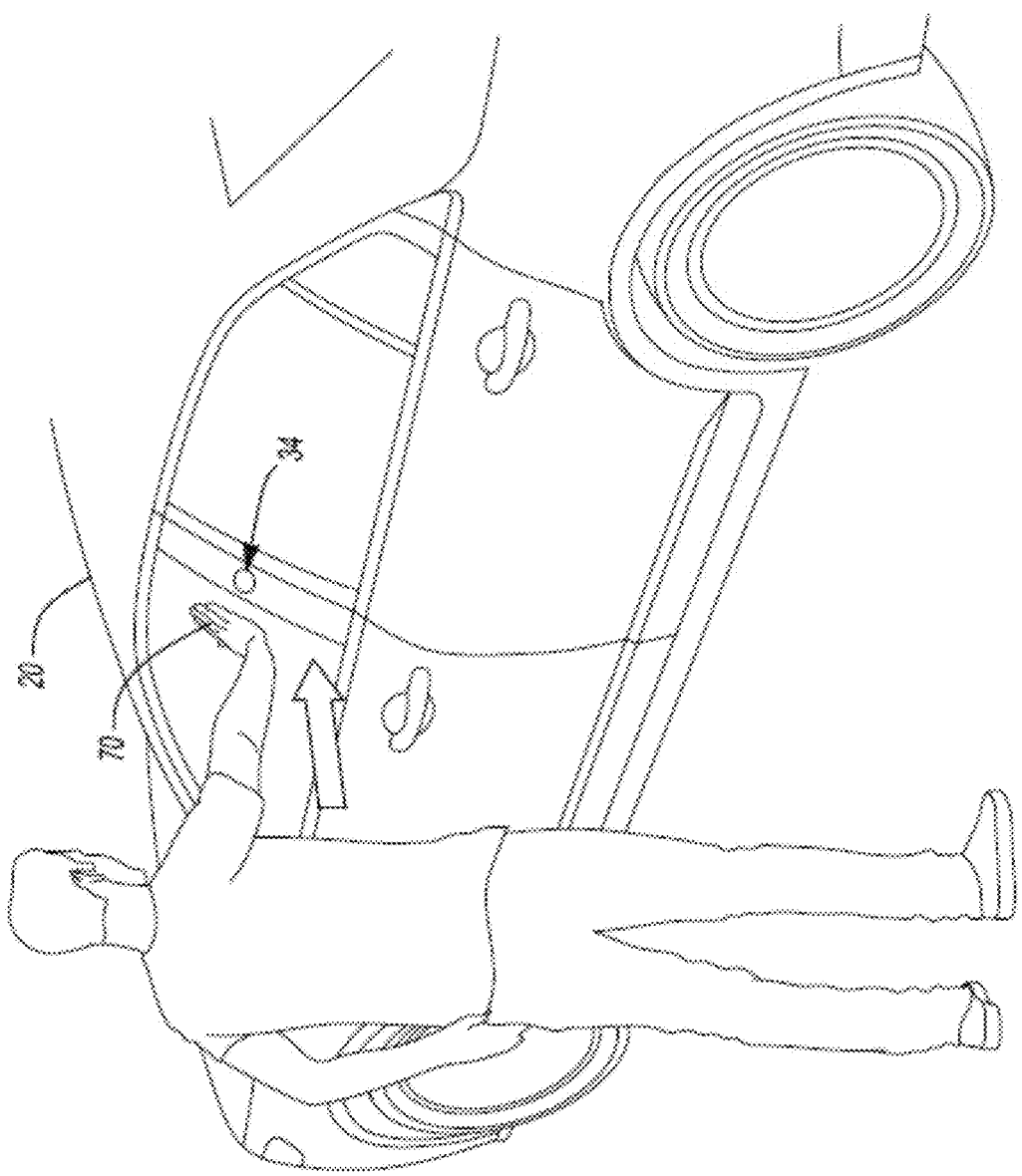
FIG. 7 illustrates a user performing a gesture moving their hand forward toward the keypad assembly according to aspects of the disclosure.

Referring now to FIGS. 6-7, an embodiment of the electromagnetic-based sensor system 10 includes the gesture sensor 34 disposed adjacent a door of a vehicle 20. FIG. 6 shows an example gesture where the gesture sensor 34 detects the user moving their hand 70 backward away from the vehicle 20 to cause the door to be opened. FIG. 7 shows an example gesture where the gesture sensor 34 detects the user moving their hand 70 toward the vehicle 20 to cause the door to be latched closed.

Figure 8:
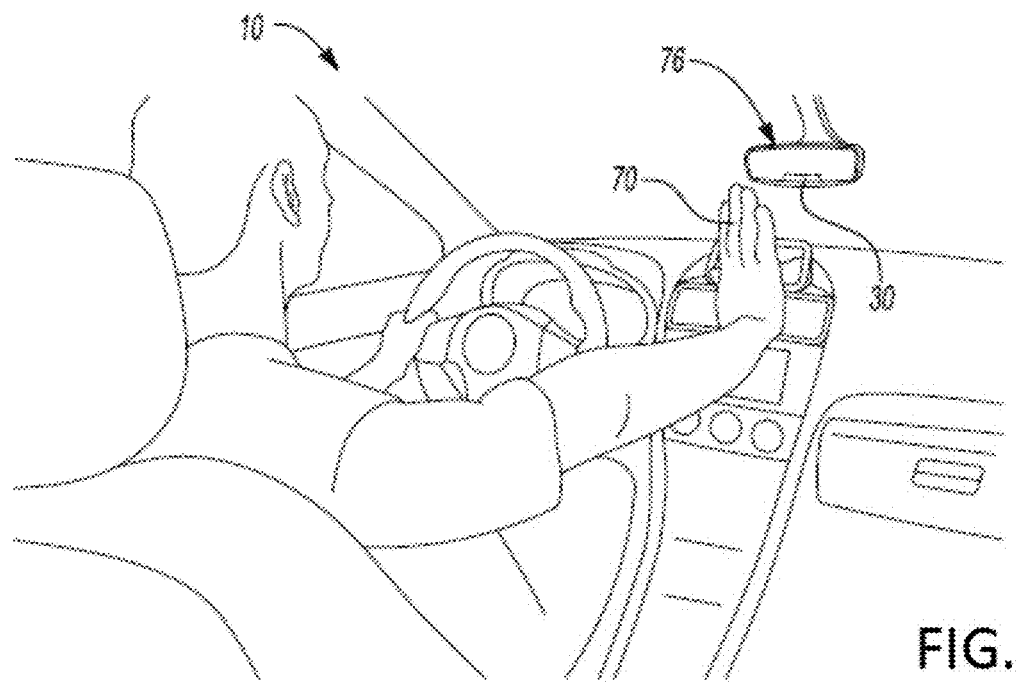
FIG. 8 illustrates a user placing their palm in front of an interior rear view mirror for biometric authentication according to aspects of the disclosure.

Referring now to FIG. 8, an embodiment of the electromagnetic-based sensor system 10 includes the sensor assembly 30 being located inside the vehicle 20 for recognizing the user as a specific person. More specifically, FIG. 8 shows the sensor assembly 30 located within an interior rear view mirror 76.

Figure 9:
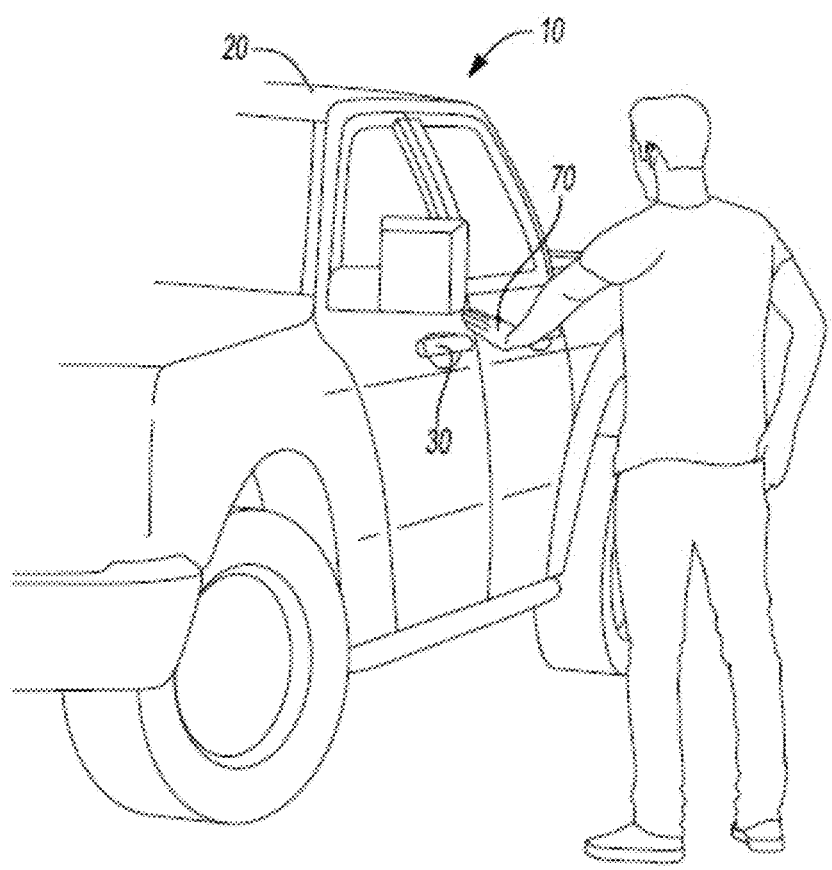
FIG. 9 illustrates a user placing their palm in front of an exterior door handle for biometric authentication according to aspects of the disclosure.

Referring now to FIG. 9, an embodiment of the electromagnetic-based sensor system 10 includes the sensor assembly 30 disposed within a handle of a closure of a vehicle 20. Specifically, the sensor assembly 30 is shown in a driver door handle. However, it should be understood that the sensor assembly 30 may be located within any door handle or in the handle of another closure, such as a tailgate or a lift gate.

Figure 10:
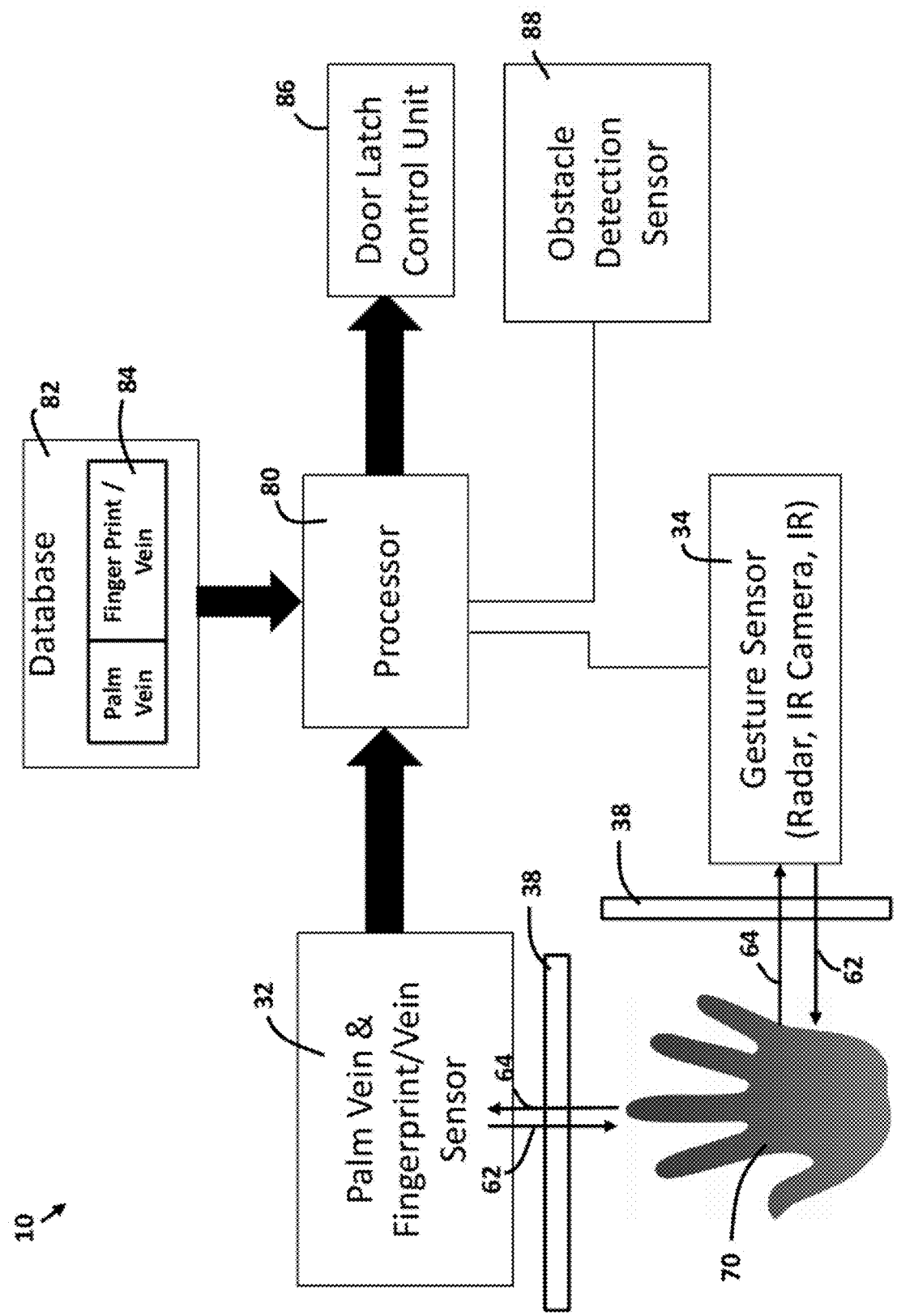
FIG. 10 is a block diagram of an electromagnetic-based sensor system according to aspects of the disclosure.

Referring now to FIG. 10, a block diagram of an example embodiment of the of the electromagnetic-based sensor system 10 includes the biometric identification sensor 32 and the gesture sensor 34 each being in communication with a processor 80, which may be the processor 80 within the controller 72 as discussed above with reference to FIG. 4. As shown in FIG. 10, the system 10 also includes the processor receiving information from a database 82 that contains one or more entries 84 with biometric profile data such as data regarding a pattern of palm veins and/or data regarding fingerprints and/or finger veins. Entries 84 may also include data relating to activation gestures sequences accessible by the processor 80 for comparing with a detected gesture sequences by the sensor 34 for comparison therewith e.g. motion patterns, such as up, down, side to side, rotation etc., time delays relating to the gestures, body part shapes and outlines, and the like. The processor may compare information received from the biometric identification sensor 32 with the biometric profile data in the database 82 to determine if the body part 70 matches the profile data associated with an authorized user. FIG. 10 also shows the processor 80 being in communication with a door latch control unit 86. In some embodiments, the processor may command the door latch control unit 86 to cause the door to be locked or unlocked or opened or closed in response to the detection of an authenticated user and/or the detection of a specific gesture by the gesture sensor 34. FIG. 10 also shows an obstacle detection sensor 88 in communication with the processor 80.

Referring now to FIG. 11, a block diagram of an example embodiment of a biometric identification sensor 32 that is a palm vein sensor is shown and described. Palm vein sensing, which is a type of vascular pattern recognition. Vascular pattern recognition, also commonly referred to as vein pattern authentication, uses near-infrared light to reflect or transmit images of blood vessels. Researchers have determined that the vascular pattern of the human body is unique to a specific individual and does not change as people age. Specifically, FIG. 11 shows a cross-section 70a of a body part 70 that is a palm of the hand. The biometric identification sensor 32 includes an electromagnetic radiation receiver 92, such as an IR imager that includes a detector to produce a digital image 93 using IR light that may be focused by one or more lenses 94. An electromagnetic radiation source 96, such as a laser diode unit are provided to generate and transmit electromagnetic radiation, such as IR light upon the body part 70.

Figure 14:
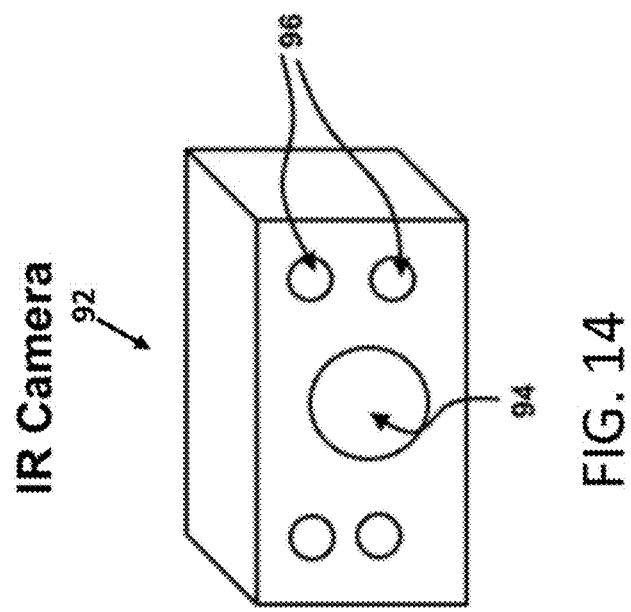
FIG. 14 illustrates an example infrared (IR) camera according to aspects of the disclosure.
Figure 12:
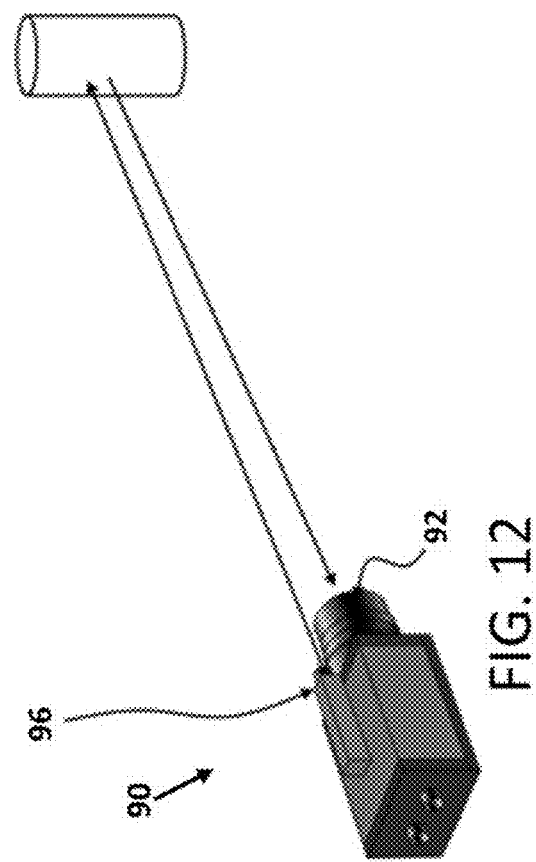
FIG. 12 illustrates an example camera configured to determine time of flight (TOF) of light according to aspects of the disclosure.
Figure 13:
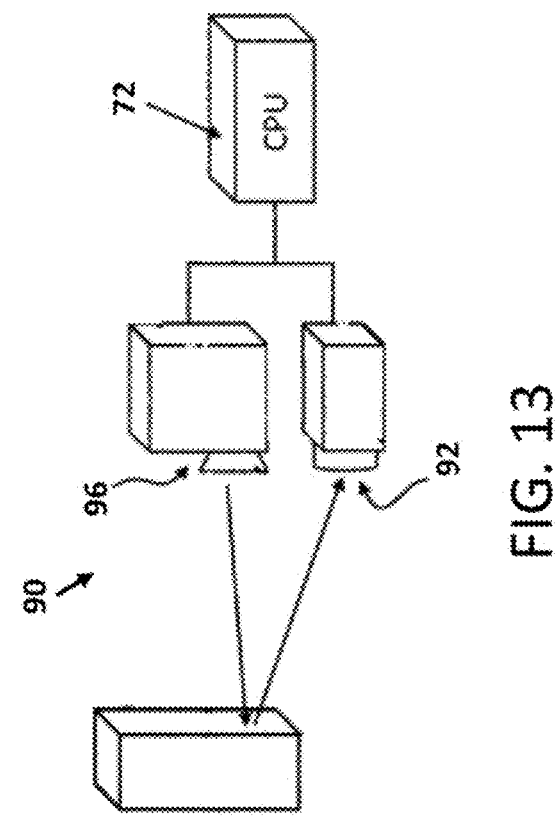
FIG. 13 illustrates an example camera configured to determine time of flight (TOF) of light according to aspects of the disclosure.

FIGS. 12-13 illustrate two different time-of-flight (TOF) cameras 90 that may be used in the gesture sensor 34, with each of the TOF cameras 90 including an electromagnetic radiation source 96 and an electromagnetic radiation receiver 92. Each of the TOF cameras 90 are configured to determine a distance to an object by measuring a difference between electromagnetic radiation projected from the electromagnetic radiation source 96 and electromagnetic radiation received by the electromagnetic radiation receiver 92, after reflecting from the object. The TOF camera 90 shown in FIG. 13 includes a controller 72, which may be called a central processing unit (CPU), and which may include one or more microprocessors, microcontrollers, application specific integrated circuits (ASICs), or other processing devices, and which may be configured to determine distance, position, and/or motion characteristics of the object. FIG. 14 illustrates an infrared (IR) camera that may be used as the electromagnetic radiation receiver 92 in the gesture sensor 34. The IR camera includes a lens 94 surrounded by several electromagnetic radiation sources 96. For example, the electromagnetic radiation sources 96 may be IR light emitting diodes (LEDs) that provide non-visible infrared illumination.

Figure 15:
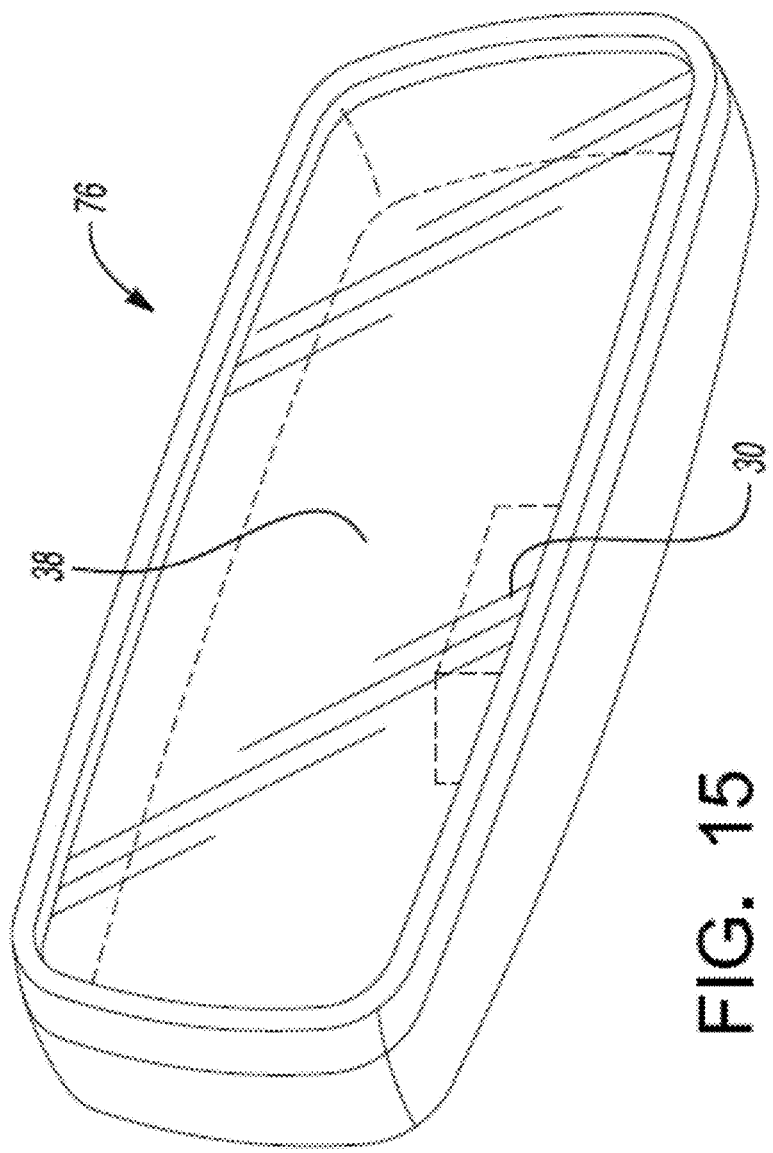
FIG. 15 illustrates an example interior rearview mirror according to aspects of the disclosure.

FIG. 15 illustrates an interior rearview mirror 76 according to aspects of the disclosure. The interior rearview mirror 76 shown in FIG. 15 includes a housing holding a mirror 38 for proving a driver with a view behind the vehicle 20. The interior rearview mirror 76 also includes the sensor assembly 30 disposed behind the mirror 38 and operable to sense an object through the mirror 38. Thus, the sensor assembly 30 in the interior rearview mirror 76 may be used for a number of purposes including gesture recognition and/or biometric identification of a particular person.

FIGS. 16A-16B illustrate a door handle 16 according to aspects of the disclosure. Specifically, FIG. 16A shows a cold mirror 38 overlying a sensor assembly 30. FIG. 16B shows the door handle 16 of FIG. 16A, but without the cold mirror 38 to show details of an example sensor assembly 30. Specifically, the example sensor assembly 30 shown in FIG. 16B includes a time-of-flight (TOF) camera 90 and an infrared (IR) camera 92 surrounded by several IR light emitting diodes (LEDs) 96 that provide non-visible infrared illumination. Either or both of the time-of-flight (TOF) camera 90 and/or the infrared (IR) camera 92 may be used as a biometric identification sensor 32 and/or as a gesture sensor 34.

Figure 17A:
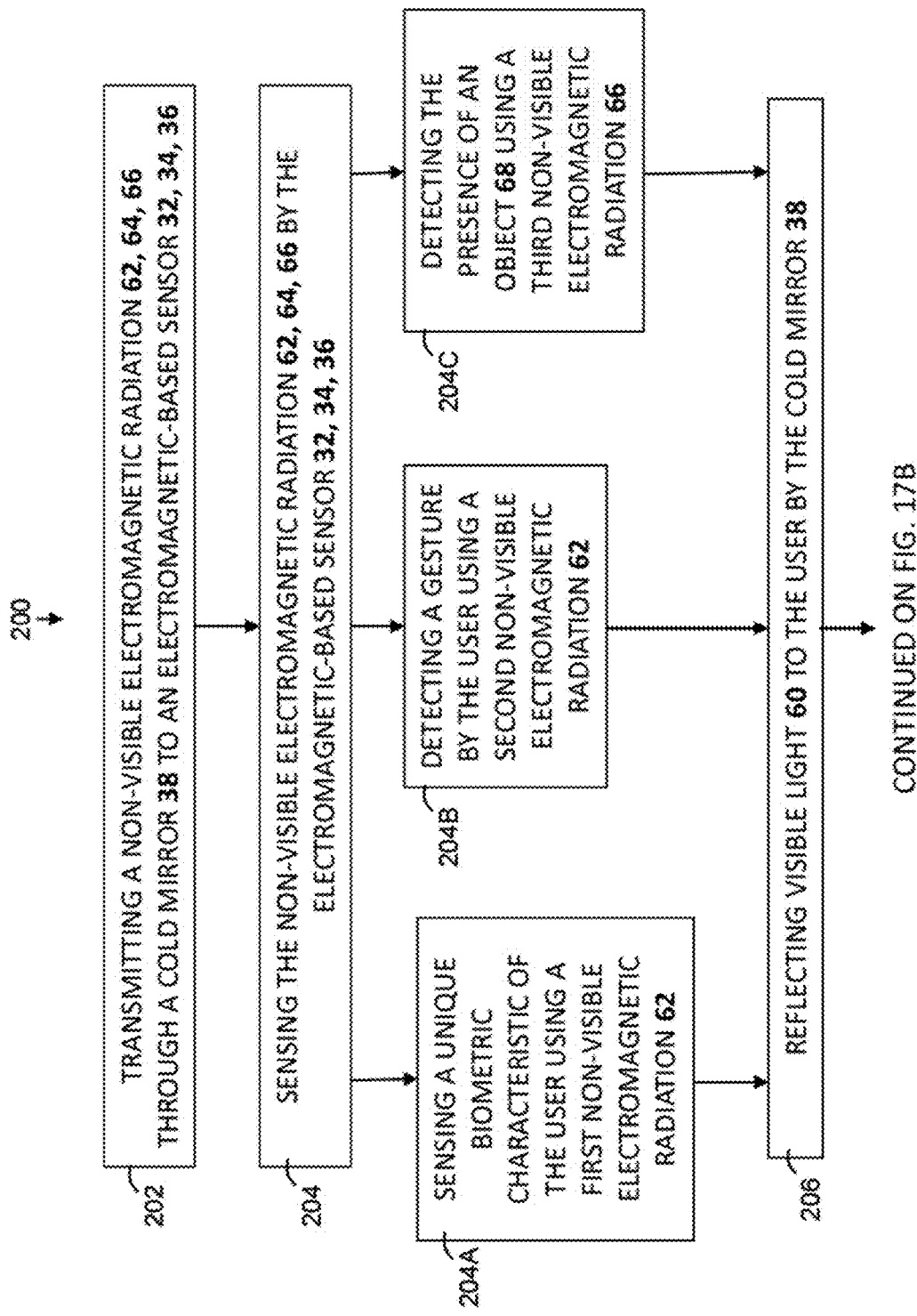
FIG. 17A is a flow chart listing steps in a method for operating a sensor assembly.
Figure 17B:
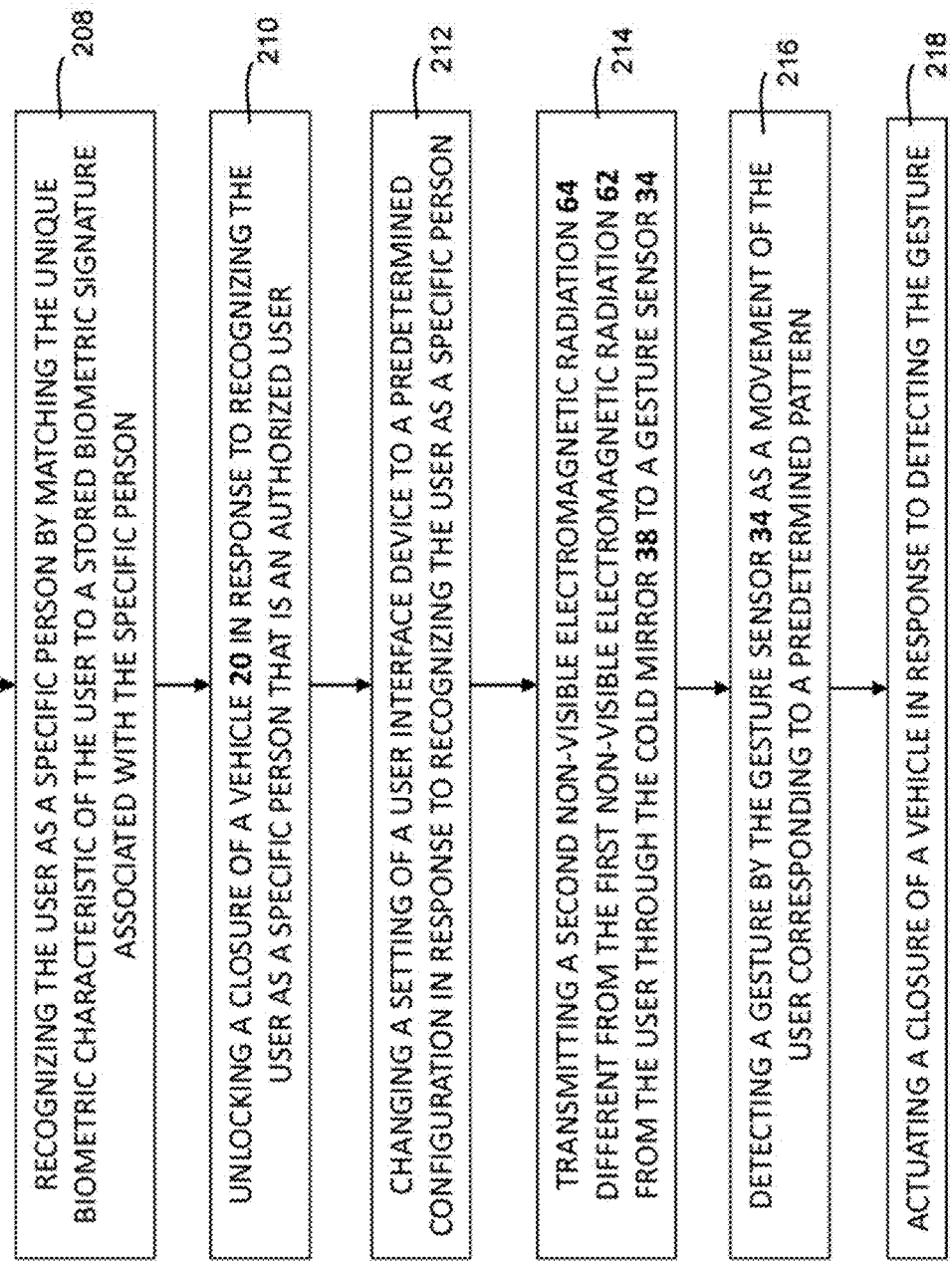
FIG. 17B is a continuation of the flow chart of FIG. 17A.

As shown in the flow chart of FIGS. 17A-17B, a method 200 for operating a sensor system 10 is also provided. The method 200 includes transmitting a non-visible electromagnetic radiation 62, 64, 66 through a mirror 38 to an electromagnetic-based sensor 32, 34, 36 at step 202. The method 200 also includes sensing the non-visible electromagnetic radiation 62, 64, 66 by the electromagnetic-based sensor 32, 34, 36 at step 204. The method 200 also includes reflecting visible light by the mirror 38 at step 206.

In some embodiments, step 204 may include sensing a unique biometric characteristic of the user using a first non-visible electromagnetic radiation 62 at sub-step 204A. Specifically, sub-step 204A may include the electromagnetic-based sensor 32, 34, 36 being a biometric identification sensor 32.

In some embodiments, step 204 may include detecting a gesture by the user using a second non-visible electromagnetic radiation 64 at sub-step 204B. Specifically, sub-step 204B may include the electromagnetic-based sensor 32, 34, 36 being a gesture sensor 34.

In some embodiments, step 204 may include detecting the presence of an object 68 near the sensor assembly 30 using a third non-visible electromagnetic radiation 66 at sub-step 204C. Specifically, sub-step 204C may include the electromagnetic-based sensor 32, 34, 36 being an object detection sensor 36. More specifically, sub-step 204C may include detecting the presence of the object 68 in proximity to the sensor assembly 30 by an object detection sensor 36 using a third non-visible electromagnetic radiation 66. For example, the object 68 may be a vehicle, a person, and/or a stationary object. This sub-step 204C may be used, for example, as part of a blind-spot monitoring system, an adaptive cruise control system (ACC), or a parking assistance system to detect proximity of the vehicle 20 to the object 68.

In some embodiments, the method 200 may include recognizing the user as a specific person by matching the unique biometric characteristic of the user to a stored biometric signature associated with the specific person at step 208. This step 208 may include, for example, comparing data, such as an image showing a biometric characteristic of the user, as sensed by the biometric identification sensor 32 with data entries 84 representing one or more known or authorized users. This step 208 may be performed by a processor 80 as described above with reference to FIG. 10. In some embodiments, the unique biometric characteristic is a pattern of veins within a body part 70 of the user. The unique biometric characteristic may be the pattern of veins in the palm of the hand. Alternatively or additionally, the unique biometric characteristic may be a pattern of veins in a different body part 70, such as a finger or a face. This step 208 may involve recognizing two or more different biometric characteristic of the user, such as, for example a pattern of veins within a body part 70 and a fingerprint or a facial pattern. Controller 72 may be configured to execute instructions stored in a controller memory for implementing a biometric identification recognition algorithm, for example for executing steps forming part of a method including steps whereby a fingerprint is digitized, a digitized background is subtracted from the fingerprint, resulting in a difference print, and the difference print is matched with a database of fingerprint template, for example as described in more detail for illustration only in U.S. Pat. No. 6,741,729.

In some embodiments, the method 200 may also include unlocking a closure of a vehicle 20 in response to recognizing the user as a specific person that is an authorized user at step 210. The closure may be, for example, a door, a window, a tailgate or a lift gate. For example, the driver door or all the doors of a vehicle may be unlocked in response to recognizing a specific person located outside of the vehicle adjacent the driver door.

In some embodiments, the method 200 may also include changing a setting of a user interface device in response to recognizing the user as a specific person at step 212. The user interface device may be changed to a predetermined configuration that may be stored as a profile data associated with the specific person. For example, an electromagnetic-based sensor system 10 in a motor vehicle 20 may be configured to change one or more of a seat position, a mirror position of one or more adjustable mirrors, a climate control setting, and/or a setting of an infotainment system. In one example, the system 10 may recognize a specific person and adjust the driver seat and mirrors to pre-stored positions associated with that specific person. The system 10 may also change one or more climate control settings to values that based on preferences of that specific person. Such climate control settings may include, for example, an air temperature setting, a fan speed setting, a temperature setting for a heated or cooled seat, etc. The climate control settings may be impacted by other factors such as, for example, outside or inside air temperature or humidity. The system 10 may also change one or more settings of an infotainment system to values associated with the specific person. The infotainment system settings may include, for example, a volume setting, radio preset stations, shortcuts to destinations of a navigation system, etc.

In some embodiments, the method 200 may also include transmitting a second non-visible electromagnetic radiation 64 different from the first non-visible electromagnetic radiation 62 from the user through the mirror 38 to a gesture sensor 34 at step 214 and detecting a gesture by the gesture sensor 34 as a movement of the user corresponding to a predetermined pattern at step 216. For example, techniques for detecting a gesture may include execution by the controller 72 steps of a gesture detection algorithm, for example as described in US Patent Application No. 20130229508, which describes a method including receiving a first output from a first sensor of an electronic device and receiving a second output from a second sensor of the electronic device, where the first sensor has a first sensor type and the second sensor has a second sensor type that is different from the first sensor type.

In some embodiments, the method 200 may also include actuating a closure of a vehicle in response to detecting the gesture at step 218. For example, and as shown in FIG. 6, the gesture sensor 34 may detect the user moving their hand 70 backward away from the vehicle 20 to cause an actuator (not shown) to open the door. Similarly, as shown in FIG. 7, the gesture sensor 34 may detect the user moving their hand 70 toward the vehicle 20, causing the actuator to close the door. In another example, a tailgate or lift gate of a vehicle 20 may be opened or closed in response to the gesture sensor 34 detecting a particular gesture.

Figure 18:
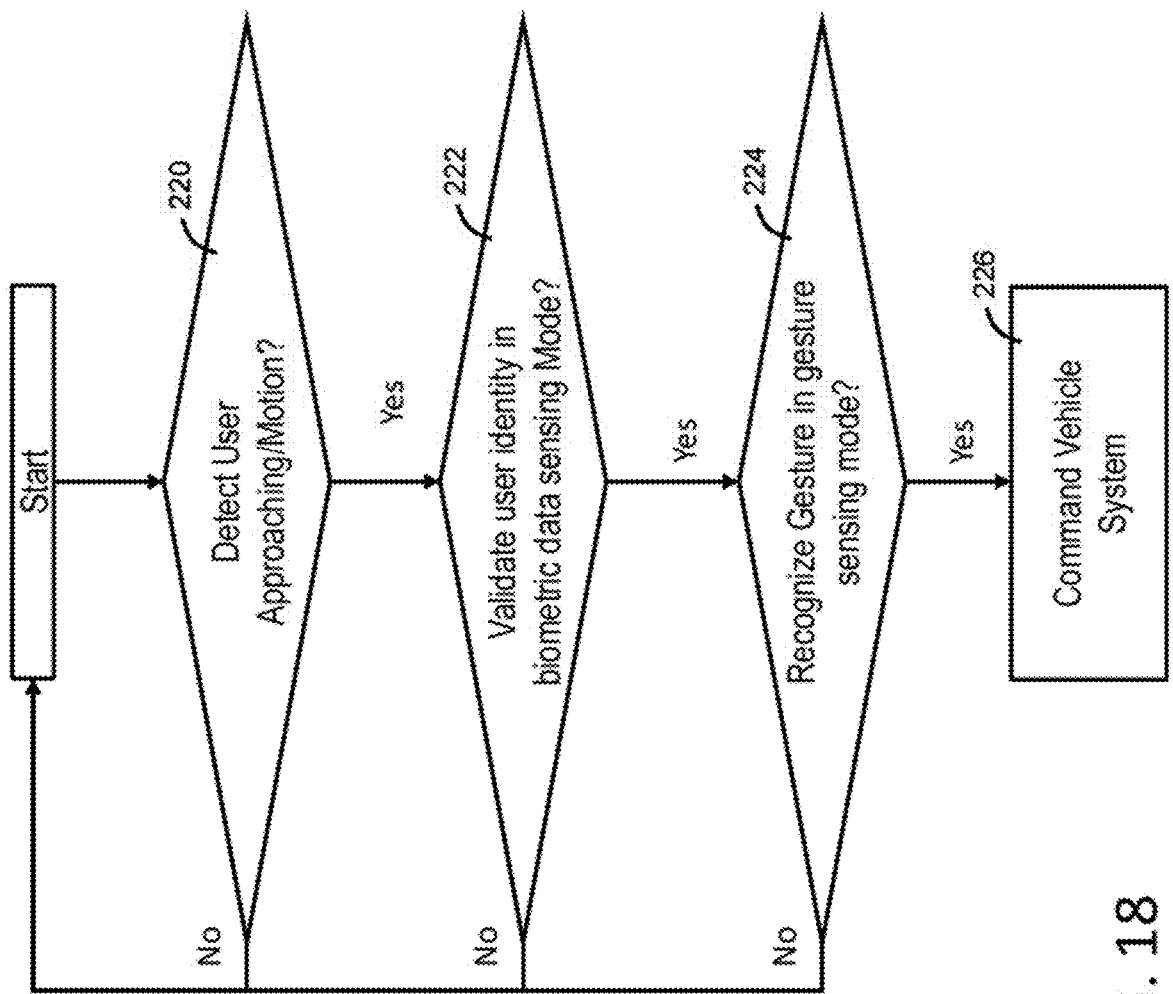
FIG. 18 is a flowchart illustrating software instructions executed by a controller, in accordance with an illustrative embodiment.

Now referring to FIG. 18, there is illustrated a software flowchart illustrating steps executed by controller 72 for a two part authentication and gesture vehicle system control. For example, controller 72 using gesture sensor 34 roughly determines for an approaching user, such as a hand or body in step Detect User Approaching/Motion at step 220. In response to detecting an approaching user, at step Validate user identity in biometric data sensing Mode, the controller 72 authenticates the biometric identity of the user, for example the palm vein or fingerprint signature as detected using biometric identification sensor 32 at step 222. Next, a user gesture is identified using gesture sensor 34 at the step Recognize Gesture in gesture sensing mode at step 224. In response to both a valid identity authentication and a correct gesture identified by the controller 72, the controller 72 commands a vehicle system, such as a door latch, or a powered door actuation system at step 226. A two-step sequential authentication system may therefore be provided one in which a biometric identifier is detected and validated/authenticated, followed by an activation gesture is detected and validated/authenticated, or vice-versa. In another possible configuration, a simultaneous authentication system may therefore be provided one in which a biometric identifier is detected and validated/authenticated, and a simultaneous an activation gesture, is detected and validated/authenticated.

Clearly, changes may be made to what is described and illustrated herein without, however, departing from the scope defined in the accompanying claims. The system disclosed herein may instead be used for other actuators or motor operated systems within the motor vehicle or for different applications, for example.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure. Those skilled in the art will recognize that concepts disclosed in association with an example switching system can likewise be implemented into many other systems to control one or more operations and/or functions.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The elements and assemblies disclosed herein may be otherwise oriented (rotated degrees or at other orientations) and the spatially relative descriptions used herein interpreted accordingly.

What is claimed is:

1. A vehicular sensor assembly comprising: an electromagnetic-based sensor configured to sense a non-visible electromagnetic radiation; and a mirror overlying the electromagnetic-based sensor, the mirror being reflective to visible light and transmissive to the non-visible electromagnetic radiation sensed by the electromagnetic-based sensor.

2. The sensor assembly as set forth in claim 1, wherein the electromagnetic-based sensor is one of a biometric identification sensor, a gesture sensor, or an object detection sensor.

3. The sensor assembly as set forth in claim 1, wherein the electromagnetic-based sensor includes a biometric identification sensor configured to project the non-visible electromagnetic radiation through the mirror; wherein the biometric identification sensor is configured to determine a unique biometric characteristic of a body part of a user by sensing the non-visible electromagnetic radiation as a first non-visible electromagnetic radiation reflected from the body part of the user; and wherein the mirror overlies the biometric identification sensor, the mirror being transmissive to the first non-visible electromagnetic radiation.

4. The sensor assembly as set forth in claim 3, wherein the body part is a palm of a hand.

5. The sensor assembly as set forth in claim 3, wherein the non-visible electromagnetic radiation is absorbed by blood in veins of the body part, making a pattern of the veins visible in an image captured by the biometric identification sensor; and wherein the unique biometric characteristic of the user is the pattern of the veins of the body part.

6. The sensor assembly as set forth in claim 1, wherein the electromagnetic-based sensor includes a gesture sensor configured to determine a gesture by a user by sensing the non-visible electromagnetic radiation as a second non-visible electromagnetic radiation; and wherein the mirror overlies the gesture sensor, the mirror being transmissive to the second non-visible electromagnetic radiation.

7. The sensor assembly as set forth in claim 1, wherein the electromagnetic-based sensor includes an object detection sensor configured to detect an object by sensing the non-visible electromagnetic radiation as a third non-visible electromagnetic radiation; and wherein the mirror overlies the object detection sensor, the mirror being transmissive to the third non-visible electromagnetic radiation.

8. The sensor assembly as set forth in claim 1, wherein the non-visible electromagnetic radiation comprises one or more of: near-infrared light, infrared light, and radio frequency radiation.

9. The sensor assembly as set forth in claim 1, wherein the non-visible electromagnetic radiation comprises two or more different frequencies of electromagnetic radiation.

10. An electromagnetic-based sensor system comprising the sensor assembly as set forth in claim 1, wherein the sensor assembly is disposed: adjacent a door of a vehicle for recognizing the user as an authorized user of the vehicle; within a handle of a closure of a vehicle; within an interior of a vehicle; or within an applique.

11. A method for operating a vehicular sensor system comprising:
transmitting a non-visible electromagnetic radiation through a mirror to an electromagnetic-based sensor;
sensing the non-visible electromagnetic radiation by the electromagnetic-based sensor; and
reflecting visible light by the mirror.

12. The method for operating a sensor system as set forth in claim 11, further comprising: transmitting the non-visible electromagnetic radiation through a mirror as emitted by the electromagnetic-based sensor; receiving by the electromagnetic-based sensor the non-visible electromagnetic radiation as a reflection from an object in front of the mirror after the transmitting the non-visible electromagnetic radiation through the mirror.

13. The method for operating a sensor system as set forth in claim 11, wherein the electromagnetic-based sensor includes a biometric identification sensor; the method further comprising: transmitting the non-visible electromagnetic radiation as a first non-visible electromagnetic radiation from the user through the mirror to the biometric identification sensor; and sensing a unique biometric characteristic of the user by the biometric identification sensor using first non-visible electromagnetic radiation.

14. The method for operating a sensor system as set forth in claim 13, further comprising recognizing the user as a specific person by matching the unique biometric characteristic of the user to a stored biometric signature associated with the specific person.

15. The method for operating a sensor system as set forth in claim 14, wherein the unique biometric characteristic of the user is a pattern of veins within a body part of the user.

16. The method for operating a sensor assembly as set forth in claim 13, further comprising: unlocking a closure of a vehicle in response to recognizing the user as a specific person that is an authorized user.

17. The method for operating a sensor system as set forth in claim 13, further comprising: changing a setting of a user interface device in response to recognizing the user as a specific person.

18. The method for operating a sensor system as set forth in claim 11, wherein the electromagnetic-based sensor includes a gesture sensor; the method further comprising: transmitting the non-visible electromagnetic radiation as a second non-visible electromagnetic radiation from the user through the mirror to the gesture sensor; and detecting a gesture by the gesture sensor as a movement of the user corresponding to a predetermined pattern.

19. The method for operating a sensor system as set forth in claim 18, further comprising: actuating a closure of a vehicle in response to detecting the gesture.

20. A vehicle surface for concealing an electromagnetic-based sensor configured to sense a non-visible electromagnetic radiation, the vehicle surface comprising: a mirror overlying the electromagnetic-based sensor, the mirror being reflective to visible light and transmissive to the non-visible electromagnetic radiation sensed by the electromagnetic-based sensor.

* * * * *